United States Patent [19]
Satani et al.

[11] Patent Number: 5,357,468
[45] Date of Patent: Oct. 18, 1994

[54] SEMICONDUCTOR MEMORY DEVICE

[75] Inventors: Norihiko Satani; Shizuo Cho; Yuichi Matsushita; Tetsuya Mitoma, all of Miyazaki, Japan

[73] Assignee: Oki Electric Industry Co., Ltd., Tokyo, Japan

[21] Appl. No.: 63,208

[22] Filed: May 18, 1993

[30] Foreign Application Priority Data

May 19, 1992 [JP] Japan .................. 4-126086

[51] Int. Cl.$^5$ .............................. G11C 7/00
[52] U.S. Cl. .................. 365/189.01; 365/189.01; 365/194; 365/203; 365/204
[58] Field of Search ............... 365/189.01, 189.07, 365/193, 194, 203, 204, 205, 207

[56] References Cited

U.S. PATENT DOCUMENTS

| | | | |
|---|---|---|---|
| 4,864,540 | 10/1989 | Hashemi et al. | 365/179 |
| 5,077,024 | 4/1991 | Tanaka et al. | 365/207 |
| 5,222,041 | 6/1993 | Nishimori et al. | 365/189.01 |

FOREIGN PATENT DOCUMENTS

| | | | |
|---|---|---|---|
| 60-138792 | 7/1985 | Japan . | |
| 1119982 | 3/1989 | Japan | 365/189.01 |
| 2-500702 | 3/1990 | Japan . | |

Primary Examiner—Eugene R. LaRoche
Assistant Examiner—Tan Nguyen
Attorney, Agent, or Firm—Edward D. Manzo

[57] ABSTRACT

A semiconductor memory device according to the present invention comprises a first and second nodes, a first power supply for supplying a supply power potential to the first node, a memory cell for storing data therein; a bit line connected to the memory cell, a sense amplifier connected to the second node, for amplifying a potential of the bit line; a switching circuit connected between the first and second nodes, for coupling the first node with second node in response to a first control signal and substantial disconnecting the first node from the second node in response to a second control signal, a detecting circuit for detecting a potential of the second node and outputting a detection signal when the potential of second node is substantialy equal to the supply power potential, a control circuit applied an address signal having a first or second logic level thereto, for outputting the first control signal in response to the address signal being the first logic level and outputting the second control signal in response to the detection signal after the address signal being the second logic level.

7 Claims, 3 Drawing Sheets

SEMICONDUCTOR MEMORY DEVICE

REFERENCE TO RELATED APPLICATION

This application claims the right of priority under 35 U.S.C.119, of Japanese Patent Application Serial No. 04-126086, filed on May 19,1992.

BACKGROUND OF THE INVENTION

1. Field of the Invention

This invention relates to a semiconductor memory device, and in particular to a semiconductor memory device restoring data in a memory cell, such as Dynamic Random Access Memory (DRAM).

2. Description of the Related Art

A semiconductor memory device capable of operating at high speed is desired by the semiconductor industry. It is necessary for the realization of "high speed" to shorten the access time, that is a cycle time (TRC). The cycle time (TRC) is defined the sum of a pulse length of a row address strobe signal $\overline{RAS}$ (TRAS) and a precharging time (TRP), that is TRC=TRAS+TRP. The lower limit of TRP is defined at a value of TRC. Consequently, the realization of the shortening of TRC means the realization of the shortening of TRAS.

A conventional semiconductor memory device, for example, is disclosed in the Japanese Laid-open publication No. 60-138792, published on Jul. 23rd, 1985.

SUMMARY OF THE INVENTION

It is an object of the present invention to provide a semiconductor memory device capable of operating at high speed.

In order to accomplish the above object, the semiconductor memory device according to the present invention comprises first and second nodes; a first power supply for supplying a supply power potential to the first node; a memory cell for storing data therein; a bit line connected to the memory cell; a sense amplifier connected to the second node, for amplifying a potential of the bit line; a switching circuit connected between the first and second nodes, for coupling the first node with second node in response to a first control signal and substantial disconnecting the first node from the second node in response to a second control signal; a detecting circuit for detecting a potential of the second node and outputting a detection signal when the potential of second node is substantially equal to the supply power potential; and a control circuit receiving an address signal having a first or second logic level thereto, for outputting the first control signal in response to the address signal being the first logic level and outputting the second control signal in response to the detection signal after the address signal being the second logic level.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Figure 1:
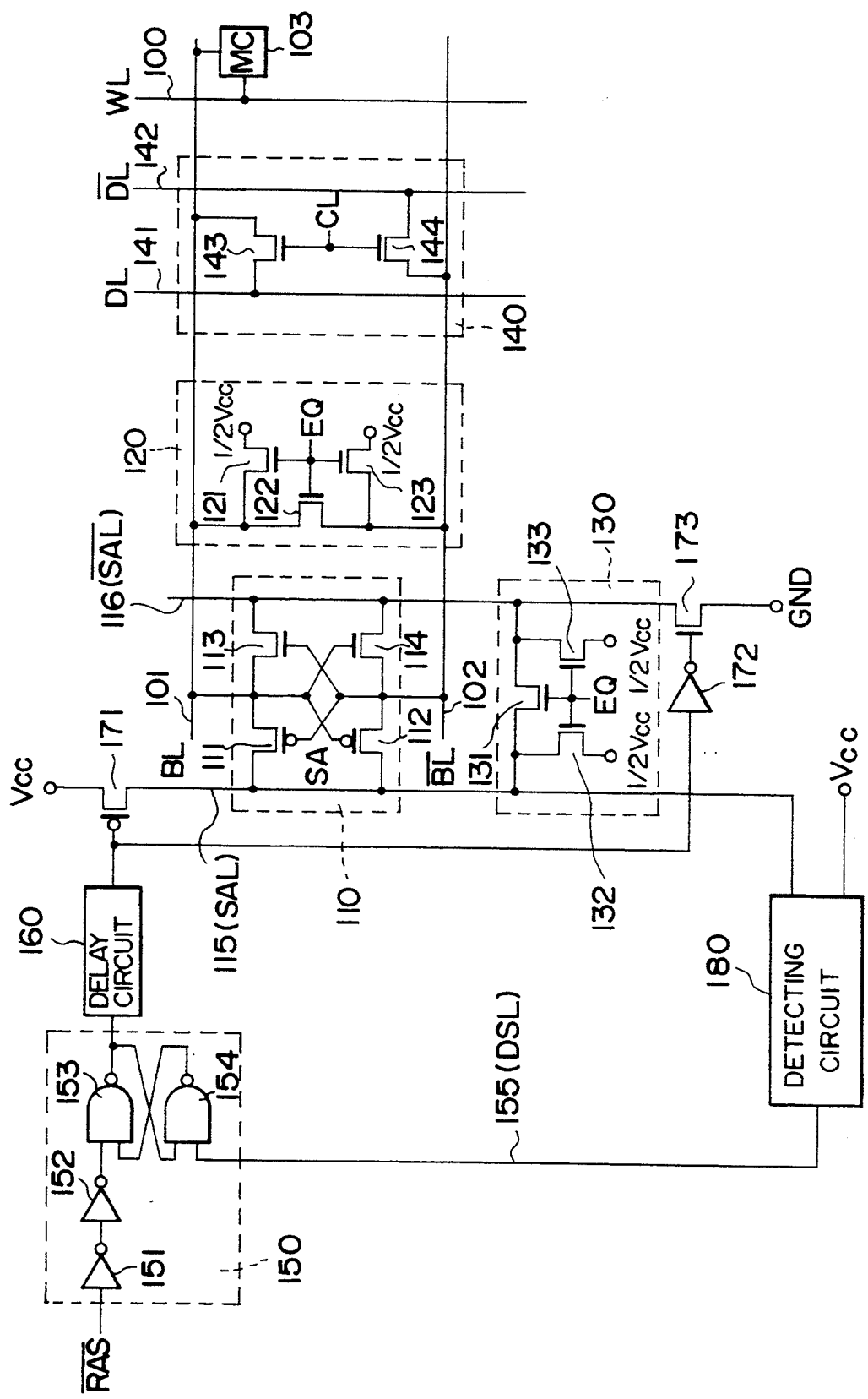
FIG. 1 is a block diagram of the semiconductor memory device constructed in accordance with the preferred embodiment of the invention.
Figure 3:
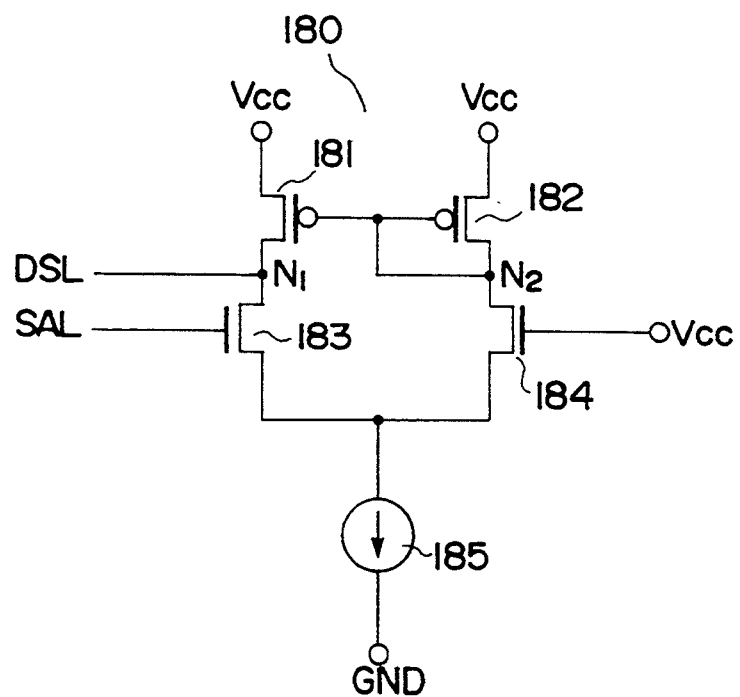
Figure 4:
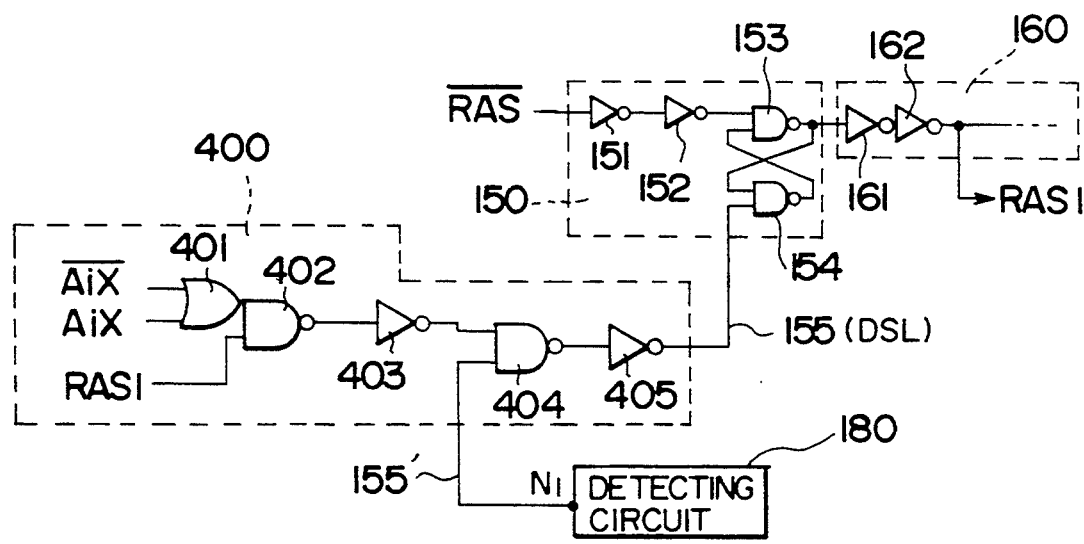
Figure 5:
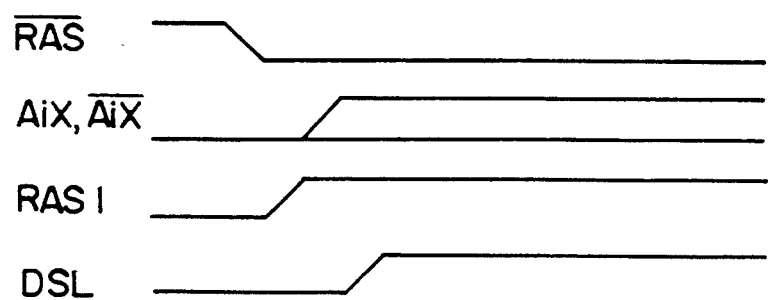

FIG .2 is a partial chart to explain the operation of the semiconductor memory device shown in FIG. 1;

FIG.3 is a circuit diagram of the detecting circuit shown in FIG. 1;

FIG.4 is a circuit diagram of the initial setting circuit according to the semiconductor memory device shown in FIG. 1;

FIG.5 is a partial chart to explain the operation of the setting circuit shown in FIG.4.

DETAILED DESCRIPTION OF THE PREFERRED EMBODIMENTS

A semiconductor memory device incorporating the present invention is shown in FIG. 1. The semiconductor memory device in this embodiment is a dynamic random access memory (DRAM).

The semiconductor memory device has a conventional word line (WL)100 and a pair of bit lines (BL,$\overline{BL}$) 101,102. A memory cell (MC) 103 for storing data is a dynamic type memory cell and is connected to the word line (WL) 100 and the bit line (BL) 101. The potential of the bit line (BL) 101 is changed in response to the data when the memory cell (MC) 103 is selected. The bit line pair (BL,$\overline{BL}$) 101,102 is connected to a sense amplifier (SA) 110.

The sense amplifies (SA) 110 amplifys the difference voltage level between lines 101,102. The sense amplifier 110 comprises a flip-flop circuit having cross-coupled first and second P-channel field effect transistors (FETs) 111,112 and cross-coupled N-channel FETs 113,114. Drains of the P-channel FET 111 and N-channel FET 113 are connected to the bit line (BL)101. Similary drains of the P-channnel FET 112 and N-channel FET 114 are connected to the bit line ($\overline{BL}$) 102. Sources of the P-channel FET 111,112 are connected to a first sense amplifier line (SAL)115 and sources of the N-channel FETs 113,114 are connected to a second, complementary sense amplifier line ($\overline{SAL}$) 116. The first sense amplifier line (SAL) 115 is connected to a first power supply having a supply voltage level (Vcc) through a first switching circuit 171, which in this embodiment is P-channel FET 171. The second sense amplifier line ($\overline{SAL}$)116 is connected to a ground (GND) having a ground voltage level through a second switching circuit 173, which in this embodiment is N-channel FET 173. A gate electrode of P-channnel FET 111 and a gate electrode of the N-channel FET 113 are commonly connected to the bit line 102. A gate electrode of P-channel FET 112 and a gate electrode of the N-channel FET 114 are commonly connected to the bit line 101.

A first equalizing circuit 120 equalizes a potential between bit lines 101,102 in response to an equalizing signal EQ applied thereto. The first equalizing circuit 120 comprises N-channel FETs 121,122,123. Drains of the N-channnel FETs 121,123 are connected to a second power supply having a half voltage level ($\frac{1}{2}$Vcc) of the first power supply. Sources of the N-channel FETs 122,123 are connected to the bit line ($\overline{BL}$) 102. A source of the N-channel FET 121 and a drain of the N-channel FET 122 are connected to bit line (BL)101. Gate electrodes of the N-channel FETs 121,122,123 receive are applied the equalizing signal EQ.

A second equalizing circuit 130 equalizes a potential between the first sense amplifier line (SAL) 115 and the second sense amplifier line (SAL) 116 in response to the equalizing signal EQ applied thereto. The second equalizing circuit 130 comprises N-channel FETs 131,132,133. Drains of the N-channel FETs 132,133 are connected to the second power supply (½Vcc). Sources of the N-channel FETs 131,132 are connected to the first sense amplifier line (SAL)115. A source of the N-channel FET 133 and a drain of the N-channel FET 131 are connected to the second sense amplifier line (SAL)116. Gate electrodes of the N-channel FETs 131,132,133 receive the equalizing signal EQ.

A transfer circuit 140 transfers the data of the pair of bit line (BL,BL) 101,102 to a pair of data lines (DL,DL) 141,142 respectively in response to a clock signal CL. The transfer circuit 140 comprises N-channel FETs 143,144. A source of the N-channel FET 143 is connected to the bit line (BL) 101 and its drain is connected to the data line (DL) 141. A source of the N-channel FET 144 is connected to the bit line (BL) 102 and its drain is connected to the data line (DL) 142. Gate electrodes of the N-channel FET 143,144 are commonly applied the clock signal CL.

A control circuit 150 controls the switching circuit 171 and the switching circuit 173 in response to a row address strobe signal (RAS) and a detection signal applied from a detection signal line (DSL)155 thereto. The control circuit 150 comprises invertors 151,152 and NAND circuits 153,154. An input of invertor 151 receives RAS and its output is connected to an input of the invertor 152. A output of invertor 152 is connected to one input of the NAND circuit 153. An output of the NAND 153 is connected to one input of the NAND 154 and to a delay circuit 160. The other input of NAND circuit 154 is connected to the detection signal line (DSL) 155. An output of the NAND circuit 154 is connected to the other input of the NAND circuit 153. The delay circuit 160 comprises a series of an odd number of invertors and is connected to the switching circuit 171. In this embodiment, the output of delay circuit 160 is applied to a gate electrode of the P-channel FET 171. It is also applied to switching circuit 173, in this embodiment that is the N-channel FET, through an invertor 172.

A detecting circuit 180 detects a potential of the first sense amplifier line (SAL) 115 and outputs a detection signal to the detection signal line (DSL)155 when the potential of the first sense amplifier line (SAL) 115 is substantially equal to the Vcc level.

FIG.3 is a circuit diagram of the detecting circuit 180. The detecting circuit 180 comprises P-channel FETs 181,182, N-channel FETs 183,184 and current source 185. Sources of P-channel FETs 181,182 are connected to the first power supply Vcc. A drain of the P-channel FET 181 is connected to a node N1. A drain of the P-channel FET 182 is connected to a node N2. Gate electrodes of P-channel FETs 181,182 are commonly connected to the node N2. Sources of N-channel FET 183,184 are connected to the current source 185. A drain of the N-channel FET 183 is connected to the node N1 and its gate electrode is connected to the first sense amplifier line (SAL) 115. A drain of N-channel FET 184 is connected to the node N2 and its gate electrode is connected to the first power supply Vcc. The node N1 is coupled to the detection signal line (DSL) 155. The current source 185 is a conventional current source which a constant electric current.

The detecting circuit 180 outputs the detection signal ("L" level) when a potential of the first sense amplifier line (SAL)115 is substantially equal to the Vcc level.

Figure 2:
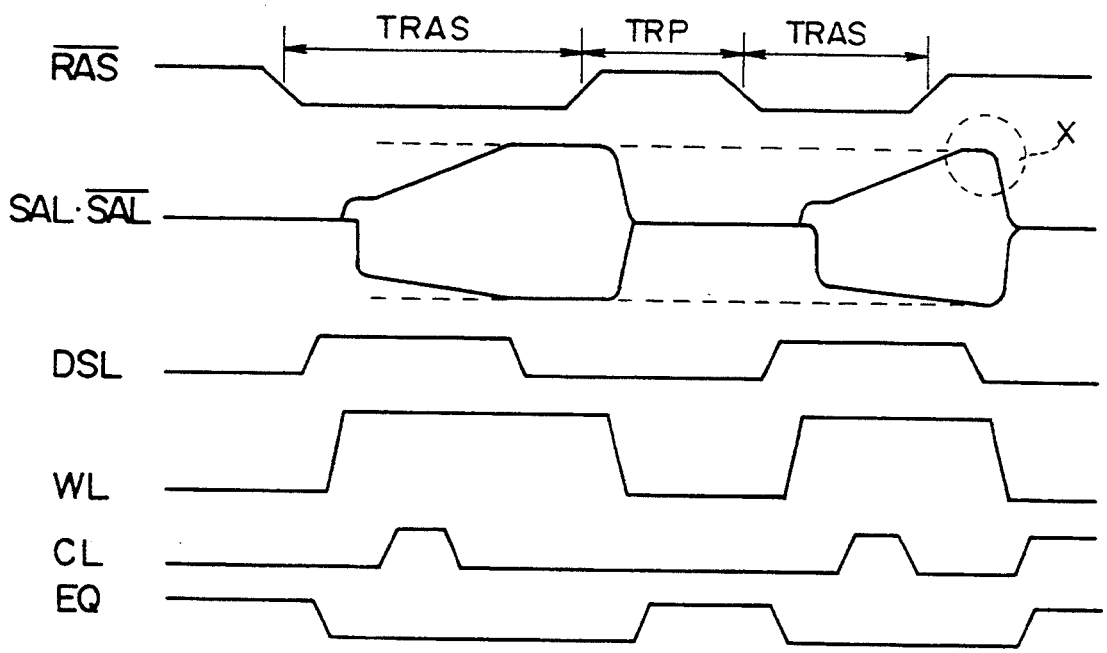

An operation of the semiconductor memory device according to this embodiment will be described with reference to operation waveforms as illustrated in FIG. 2. In FIG. 2, TRAS means a pulse length of the RAS and TRP means a precharging duration. The sum of TRAS and TRP defines one access duration cycle of the semiconductor memory device.

The row address strobe signal RAS is initially at a high level. In this embodiment, the semiconductor memory device is active when the RAS is at a low level and is inactive when the RAS is at a high level. We assume for sake of explanation that the memory cell MC 103 stores a logically high data representing "1".

When RAS goes to a low level, the equalizing signal EQ goes to a low level; hence first and second equalizing circuits 120,130 are inactive. When the word line (WL) 100 is selected (WL is at a high level), the memory cell MC 103 causes to experience a bit line BL101 coupled thereto the small change in voltage in response to the stored data therein. The control circuit 150 outputs a first control signal having a high level in response to the RAS having a low level, and the delay circuit 160 outputs delayed first control signal having a low level in response to the first control signal. Accordingly the switching circuits 171,173 turn on, a potential of the first sense amplifier line SAL 115 is gradually pulled toward the power supply potential Vcc, and a potential of the second sense amplifier line SAL 116 is gradually pulled toward the ground potential GND. And so the potential of the bit line 101 is amplified to the Vcc level, then the potential of the bit line 101 is restored in the memory cell 103 as a logically high data representing "1".

When the RAS reaches a high level at a subsequent time and the potential of the first sense amplifier line SAL 115 doesn't reach the Vcc level, control circuit 150 keeps outputting of a control signal having a high level, as the detection circuit 180 keeps outputting the detection signal having a high level.

Then when the potential of the sense amplifier line 115 reaches substantially the Vcc level, the detection circuit 180 outputs a detection signal having a low level. And the control circuit 150 outputs a second control signal having a low level in response to the detection signal. Also the delay circuit 160 outputs a delayed second control signal having a high level. In response to the high signal at the outputs of circuits 150 and 160, transistor 171 turns off to disconnect SAL from the power supply node Vcc. Similarly, transistor 173 turns off to disconnect the ground node GND from the SAL-node or line 116. Accordingly the switching circuits 171,173 turn off.

As above mentioned, as the potential of the sense amplifier line certainly reaches the Vcc level regardless of the changing of the RAS, the potential of the bit line reaches the Vcc level. So the Vcc potential is restored in the memory cell 103, and correct operation is assured. Consequently, even if the pulse length of RAS is shortened in order to operate at high speed, it is possible to provide a semiconductor memory device being capable of exactly actuating.

In this embodiment, an initial condition of the detection signal line 155 is set at low level by an initial setting circuit 400 shown in FIG. 4. The initial setting circuit 400 is connected between the detecting circuit 180 and the control circuit 150. The initial setting circuit 400 comprises an OR circuit 401, NAND circuits 402,404 and invertors 403,405. Inputs of the OR circuit 401 are coupled to receive row addresses Aix,$\overline{\text{Aix}}$. The row addresses Aix,$\overline{\text{Aix}}$ are at low level until the $\overline{\text{RAS}}$ is at low level, as shown in FIG.5. An output of the OR circuit 401 is connected to one input of the NAND circuit 402. Another input of NAND circuit 402 is applied a row address strobe signal RAS1, which is the $\overline{\text{RAS}}$ delayed through invertors 161,162 of the delay circuit 160. An output of the NAND circuit 402 is connected to an input of the invertor 403. An output of invertor 403 is connected to one input of the NAND circuit 404. Another input of the NAND circuit 404 is connected to the node N1 of detecting circuit 180 through a detection signal line 155'. An output of the NAND circuit 404 is connected to an input of the invertor 405. An output of the invertor 405 is connected to the detection signal line 155.

The initial setting circuit 400 outputs a high logic level signal to the detection signal line 155 when the first sense amplifier line (SAL) 115 reaches the Vcc level.

According, to the present invention, it is possible to provide a semiconductor memory device capable of exact operations at high speed. Therefore, it will be understood that one embodiment of the present invention as shown in FIG. 1 comprises a first node at the source electrode of transistor 171 connected to receive a first power supply potential Vcc from a first power supply; a memory cell 103 for storing data therein; a bit line 101 connected to memory cell 103; a sense amplifier 110 connected to a second node SAL; and transistor 171 which functions as a switching circuit connected between the first and second nodes. Transistor 171 couples the first node with second node in response to a first control signal (a low signal level from control circuit 150 and/or delay circuit 160) and substantially disconnects the first node from the second node in response to a second control signal (a high signal level from control circuit 150 and/or delay circuit 160). The embodiment of the invention also includes a detecting circuit 180 for detecting a potential of the second node SAL and outputting a detection signal when the potential of said second node is substantially equal to the power supply potential Vcc; and control circuit 150 having a first input DSL coupled to receive said detection signal and a second input coupled to receive an address signal RAS\ having a first or second logic level, the control circuit being effective for outputting the first control signal in response to the address signal changing to the first logic level and outputting the second control signal in response to the detection signal after the address signal returns to the second logic level.

It will be understood also that another node exists at the source of transistor 173 is connected to another power supply to receive a second voltage GND. Further node is SAL line 116 connected to the drain of transistor 173.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modification or embodiments as fall within the true scope of the invention.

What is claimed is:

1. A semiconductor memory device comprising:
   a first node connected to receive a first power supply potential from a first power supply;
   a memory cell for storing data therein;
   a bit line connected to the memory cell;
   a sense amplifier connected to a second node and coupled to the bit line, for amplifying a potential of the bit line;
   a switching circuit connected between the first and second nodes, for coupling the first node with second node in response to a first control signal and substantially disconnecting the first node from the second node in response to a second control signal;
   a detecting circuit for detecting a potential of the second node and outputting a detection signal when the potential of said second node is substantially equal to the power supply potential;
   a control circuit having a first input coupled to receive said detection signal and a second input coupled to receive an address signal having a first or second logic level, the control circuit being effective for outputting the first control signal in response to the address signal changing to the first logic level and outputting the second control signal in response to the detection signal after the address signal returns to the second logic level.

2. The semiconductor memory device according to claim 1, further comprising:
   a third node connected to the sense amplifier;
   a fourth node connected to a second power supply for supplying a second power potential thereto;
   a second switching circuit connected between the third and fourth nodes, for coupling the third node with fourth node in response to the first control signal and substantially disconnecting the third node from the fourth node in response to the second control signal.

3. A semiconductor memory device comprising:
   a first node connected to receive a first power supply potential from a first power supply;
   a memory cell for storing data therein;
   a bit line connected to the memory cell;
   a sense amplifier connected to a second node and coupled to the bit line, for amplifying a potential of the bit line;
   a switching circuit connected between the first and second nodes, the switching circuit being turned on in response to a first control signal and being turned off in response to a second control signal;
   a detecting circuit for detecting a potential of the second node and outputting a detection signal when the potential of second node is substantially equal to the supply power potential;
   a control circuit having one input for receiving an address signal having a first or second logic level and another input for receiving said detection signal, the control circuit being effective for outputting the first control signal in response to the address signal entering the first logic level and outputting the second control signal in response to the detection signal after the address signal returns to the second logic level.

4. The semiconductor memory device according to claim 3, further comprising:
   a third node connected to the sense amplifier;
   a fourth node connected to a second power supply for supplying a second power potential thereto;

a second switching circuit connected between the third and fourth nodes and being turned on in response to a first control signal and turned off in response to a second control signal.

5. A semiconductor memory device comprising:

a first node connected to receive a first power supply potential from a first power supply;

a memory cell for storing data therein;

a bit line connected to the memory cell;

a sense amplifier connected to a second node and coupled to the bit line, for amplifying a potential of the bit line;

a switching circuit connected between the first and second nodes;

a detecting circuit for detecting a potential of the second node and outputting a detection signal when the potential of second node is substantially equal to the power supply potential;

a control circuit having one input for receiving an address signal having a first or second logic level and having another input for receiving the detection signal, the control circuit being effective for causing the switching circuit to be conductive when the address signal is in the first logic level and causing the switching circuit to be substantially nonconductive in response to the detection signal after the address signal has returned to the second logic level.

6. The semiconductor memory device according to claim 5, wherein the switching circuit comprises a transistor having a source electrode, a drain electrode and a gate electrode, the source electrode being connected to the first node, the drain electrode being connected to the second node, and the gate electrode being connected to the control circuit.

7. A semiconductor memory comprising:

a first node connected to receive a first potential from a first power supply;

a second node connected to receive a second potential less than the first potential from a second power supply;

first and second bit lines;

a memory cell connected to the first bit line, for storing data therein;

a sense amplifier having third and fourth nodes and being coupled to said first and second bit lines for amplifying the voltage difference therebetween;

a first switching circuit for connecting the first node with the third node in response to a first control signal and substantially disconnecting the first node from the third node in response to a second control signal;

a second switching circuit for connecting the second node with the fourth node in response to the first control signal and substantially disconnecting the second node from the fourth node in response to the second control signal;

a detecting circuit for detecting a potential of the third node and outputting a detection signal at the time of the potential of the third node being substantially equal to the first potential;

a control circuit having one input connected to receive the detection signal and another input connected to receive an address signal having a first or second logic level, the control circuit being effective for outputting the first control signal in response to the address signal having the first logic level, and outputting the second control signal in response to the detection signal after the address signal returns to the second logic level.

* * * * *